United States Patent
Craninckx

(10) Patent No.: US 7,302,248 B2
(45) Date of Patent: Nov. 27, 2007

(54) HARMONIC IMAGE-REJECT CONVERTER

(75) Inventor: Jan Craninckx, Boutersem (BE)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 513 days.

(21) Appl. No.: 11/018,766

(22) Filed: Dec. 20, 2004

(65) Prior Publication Data

US 2005/0148310 A1     Jul. 7, 2005

(30) Foreign Application Priority Data

Dec. 19, 2003 (EP) ................. 03447297

(51) Int. Cl.
    *H04B 1/26* (2006.01)
(52) U.S. Cl. ............. 455/302; 455/318; 455/323
(58) Field of Classification Search ........ None
    See application file for complete search history.

(56) References Cited

U.S. PATENT DOCUMENTS

| 5,146,121 | A | 9/1992 | Searles et al. ......... 307/603 |
| 5,180,994 | A | 1/1993 | Martin et al. .......... 331/38 |
| 5,285,120 | A | 2/1994 | Landt ................... 307/513 |
| 6,194,947 | B1* | 2/2001 | Lee et al. ............. 327/359 |
| 6,980,787 | B1* | 12/2005 | Dujmenovic .......... 455/318 |
| 2002/0039052 | A1 | 4/2002 | Straub et al. .......... 331/45 |

FOREIGN PATENT DOCUMENTS

EP     0261451     3/1988

OTHER PUBLICATIONS

Barrie Gilbert, "*A Precise Four-Quadrant Multiplier with Subnonosecond Response*", IEEE Journal of Solid-State Circuits, vol. sc-3, No. 4, pp. 365-373 (Dec. 1968).

Takafumi Yamaji, Hiroshi Tanimoto and Hideyuki Kokatsu, "*An I/Q Active Balanced Harmonic Mixer with IM2 Cancelers and a 45° Phase Shifter*", IEEE Journal of Solid-State Circuits, vol. 33, No. 12, pp. 2240-2246 (Dec. 1998).

\* cited by examiner

*Primary Examiner*—Thanh Cong Le
(74) *Attorney, Agent, or Firm*—McDonnell Boehnen Hulbert & Berghoff LLP

(57) ABSTRACT

A signal generator for generating signals that are spaced $\pi/X$ rad apart, where X is an integer. The signal generator includes at least one delay cell with a delay that approximately corresponds to a phase shift $\pi/X$ rad for a given signal. The signal generator also includes at least one phase detection system receiving at least two signals with a phase difference of approximately $\pi/2$ rad with respect to one another from said at least one delay cell and generating a feedback signal that is communicated to the at least one delay cell to adjust the phase relationship of the at least two signals. Such signal generators are used in radio frequency up-converters or down-converters.

20 Claims, 3 Drawing Sheets

HARMONIC IMAGE-REJECT CONVERTER

CROSS REFERENCE TO RELATED APPLICATIONS

This application claims the benefit under 35 U.S.C. § 119(a) of European patent application EP 03447297.7, filed on Dec. 19, 2003. European Patent Application 03447238.1 is herein incorporated by reference in its entirety.

BACKGROUND

1. Field

This invention relates generally to radio frequency communications and, more specifically, to devices and circuits for generating signals to be used for frequency conversion in image-reject mixers.

2. Description of Related Art

To implement low-cost single-chip radio frequency (RF) transceivers, current architectures employ zero intermediate-frequency (zero-IF) or low-IF techniques. In such approaches, image frequency signals are not suppressed by filtering as was the case with previous heterodyne architectures. In current zero-IF and/or low-IF architectures, image-reject or quadrature up-conversion and down-conversion mixers are used. One drawback of such image-rejection transceivers is that they rely on a local oscillators (LOs) that have an in-phase component (I) and a quadrature component (Q) that are phase spaced exactly 90° apart. As a result of this phase relationship, the I and Q LO signals often cause functional difficulties in practical implementations.

For example, in one such embodiment the LO signals in quadrature are generated by a 4-stage ring oscillator. Most ring oscillator implementations, however, generate a significant enough amount of phase noise that they are impracticable for use in most telecommunications applications. Alternatively, the LO signals (I and Q) generation can be generated from a signal that is generated by a voltage controller oscillator (VCO) coupled with a resistive-capacitive/capacitive-resistive (RC/CR) circuit. In such an embodiment, the performance of the circuit is dependent on the RC time constant of the RC/CR circuit being equal to the input signal period. Such a relationship is difficult to achieve due to normal manufacturing variation of resistors and capacitors used in such an RC/CR circuit. Furthermore, in such embodiments, the oscillator typically runs at the same frequency as the RF output signal, which results in the VCO being susceptible to pulling by (interference from) the RF power amplifier. This pulling results in unwanted spurious variations in the output signal of such circuits.

Another approach that has been implemented is the use of a quadrature inductive-capacitive (LC) oscillator that includes two high-quality LC oscillators coupled in such a way that their output signals are spaced 90° apart. However, for such embodiments, the two LC oscillators take up a large area (such as in an integrated circuit) and they are also very susceptible to pulling, as was described above.

Still another approach that could be employed is to use a local oscillator that operates at twice the frequency of the output signal. In such an implementation, signals in quadrature can be obtained with a simple divide-by-2 toggle flip-flop. However, an oscillator operating at twice the operating frequency (e.g., radio frequency) of the output signals, even if possible notwithstanding technological limitations, would consume a large amount of power, which is undesirable. Furthermore, such an approach would not adequately resolve the pulling problem either, as the VCO could still be pulled by the second harmonic of the power amplifier.

SUMMARY

Local oscillator circuits and mixer circuits for use in image-reject mixer devices and circuits that address at least some of the foregoing concerns are disclosed. In one embodiment, a local oscillator (LO) signal generator is implemented that generates two or more signals that are spaced $\pi/X$ radians (rad) apart, where X is an integer value. The local oscillator includes a delay line that includes at least one tunable delay cell. The tunable delay cell(s) have a nominal delay such that each delay cell phase shifts a signal of a given period by approximately $\pi/X$ rad.

The LO signal generator further includes a phase detection system coupled with the delay line. The phase detection system receives at least two signals delayed by the delay cell(s) of the delay line and generates a feedback signal to at least one of the delay cell(s) based on a comparison of the received signals. In such an embodiment, the combination of the delay cell(s) and the phase detection system provides the $\pi/X$ rad phase shifting of the LO signals. In one particular embodiment, the value of X equals 4 and the signals received by the phase detecting system are delayed by $\pi/2$ rad with respect to one another. Such an approach compensates for process variation in the circuit elements of such a local oscillator through the use of feedback. Such an approach also significantly reduces the effects of pulling as described above, as it allows for the use of reduced frequency local oscillator signals.

The phase detection system may include any number of types of circuits. For example, in a particular embodiment, the phase detection system includes one or more mixer circuits that are coupled with a low-pass filter for filtering the feedback signal (e.g., to remove any RF component that may exist due to interference between signal lines). The feedback signal is then communicated (from the low-pass filter) to one or more of the delays cells of the delay line.

In one embodiment, a device or circuit may be used that converts at least two signals (e.g., local oscillator signals) of a first frequency to a signal of a second frequency, where the first frequency is a sub-harmonic of the second frequency. Such a device or circuit may include a first circuit that combines the at least two signals to generate at least one signal of the second frequency. In a particular implementation, the at least two signals being combined by the first circuit are spaced $2\pi/X$ rad apart and the second frequency is X/2 times larger than the first frequency, where X equals 4.

The device or circuit for converting the at least two signals may further include a second circuit that combines at least two additional signals of the first frequency to generate a second signal set containing at least one additional signal of the second frequency. As with the signals combined by the first circuit, the at least two signals combined by the second circuit are spaced $2\pi/X$ rad apart, the second frequency is X/2 times larger than the first frequency and X equals 4. For each of the at least two signals to be combined by the second circuit, there is a corresponding signal of the signals to be combined by the first circuit, where the corresponding signals differ by $\pi/X$ rad in phase. This situation results in the first and second signal sets of the second frequency being spaced $\pi/2$ apart.

In yet another embodiment, a harmonic up-converter includes a frequency multiplier. The frequency multiplier includes a local oscillator running at a sub-harmonic frequency of a transceived signal (either a transmitted signal or a received signal) and generates at least one output signal. The up-converter further includes a circuit for actively generating signals that are spaced $\pi/2N$ rad apart, where N is an integer. In this context, 'actively' means that no passive components, such as resistors or capacitors, are used. The local oscillator of the up-converter runs at the Nth sub-harmonic frequency of the transceived signal. The at least one output signal of the frequency multiplier is generated by the signals that are spaced $\pi/2N$ rad apart. In this embodiment, the circuit used for frequency conversion generates an in-phase output signal and a quadrature output signal.

These and other aspects will become apparent to those of ordinary skill in the art by reading the following detailed description, with reference, where appropriate, to the accompanying drawings. Further, it should be understood that the embodiments noted in this summary are only examples and not intended to limit the scope of the invention as claimed.

BRIEF DESCRIPTION OF THE DRAWINGS

Exemplary embodiments of the present invention are described herein with reference to the drawings, in which.

DETAILED DESCRIPTION

While embodiments of RF devices and circuits are discussed generally in the context of up-converters, it will be appreciated that the invention is not limited in this respect and that embodiments of the invention may be implemented in other types of circuits and devices, such as, for example, down-converters and mixers. As in most circuit applications, it will also be appreciated that many of the elements of the various embodiments may be implemented as discrete components or in conjunction with other components, in any suitable combination and location, such as in an integrated circuit.

Prior Approaches

Figure 1:
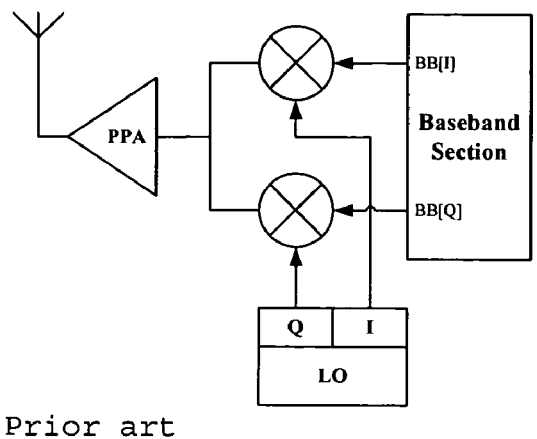
FIG. 1 is a schematic diagram that illustrates a prior art direct up-conversion transmitter.

Referring to FIG. 1, a schematic diagram illustrating a prior art up-converter is shown. FIG. 1 illustrates a direct up-conversion (or zero-IF) transmitter. For the circuit shown in FIG. 1, the baseband signals may be defined as:

$BB_I = \cos(\omega_{BB} \cdot t)$ $BB_Q = \sin(\omega_{BB} \cdot t)$

For the circuit of FIG. 1, the in-phase ($LO_I$) and quadrature ($LO_Q$) local oscillator (LO) signals may be defined as:

$LO_I = \cos(\omega_{LO} \cdot t)$ $LO_Q = \sin(\omega_{LO} \cdot t)$

Given the foregoing, the circuit shown in FIG. 1 operates in accordance with the following function:

$$\begin{aligned} RF &= BB_I \cdot LO_Q + BB_Q \cdot LO_I \\ &= \cos(\omega_{BB} \cdot t) \times \sin(\omega_{LO} \cdot t) + \sin(\omega_{BB} \cdot t) \times \cos(\omega_{LO} \cdot t) \\ &= \sin((\omega_{LO} + \omega_{BB}) \cdot t) \\ &= \sin(\omega_{RF} \cdot t) \end{aligned}$$

This function represents the function of an ideal single-sideband mixer. It will be appreciated that a similar calculation can be performed to represent the operation of a receiver side of such a single-sideband mixer.

Figure 2:
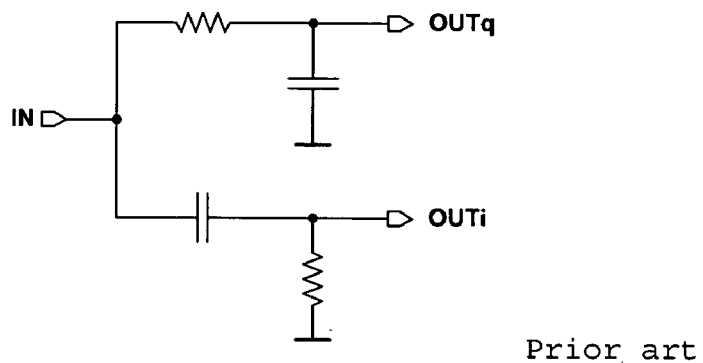
FIG. 2 is a schematic diagram that illustrates a prior art RC/CR phase shifter.

The generation of the LO signals in quadrature (phase shifted) may be performed starting from a normal voltage controlled oscillator (VCO) input signal (IN) using an RC/CR circuit, as is shown in FIG. 2. If the RC-time constants of the circuit of FIG. 2 are equal to the frequency of the input signal, one path shifts the phase by +45° and the other path shifts by −45°, thus generating two LO signals (OUTi and OUTq) that are 90° apart in phase. However, use of an RC/CR phase shifter has certain drawbacks.

One drawback of RC/CR circuits, such as the circuit illustrated in FIG. 2, is that, due to process variations (e.g., semiconductor process variations), the RC time constants very rarely equal the input frequency if the input signal IN. While this does not substantially influence the phase difference between the two output signals (OUTi and OUTq), it does substantially influence the amplitude of the output signals. Therefore, if the mixers used in, for example, an up-converter including the RC/CR circuit are susceptible to the amplitude of their LO signals, such a circuit will not provide adequate image rejection.

Extensions of the basic RC/CR phase shifter shown in FIG. 2 are polyphase networks. Polyphase networks use several sections operating at different frequencies in order to obtain good image rejection over a wide frequency band. Polyphase networks, however, consume a lot of space (such as in an integrated circuit) and also consume a considerable amount of power, both of which are undesirable.

Another drawback of RC/CR phase shift circuits is that the oscillator in the LO signal generator is running at substantially the same frequency as the RF output signal. This configuration makes the VCO of the LO signal generator highly susceptible to pulling by the power amplifier in the transmit mode. This situation may create unwanted spurious variations in the output signal.

In the receive mode, DC offsets occur during down-mixing of the received RF signal with the VCO signal as a result of electromagnetic interference. These DC offsets are a major problem for implementing zero-IF receivers as they result in substantial variation from the operation of an ideal single-sideband converter, as was described above.

Harmonic Image-reject Converters

Figure 3:
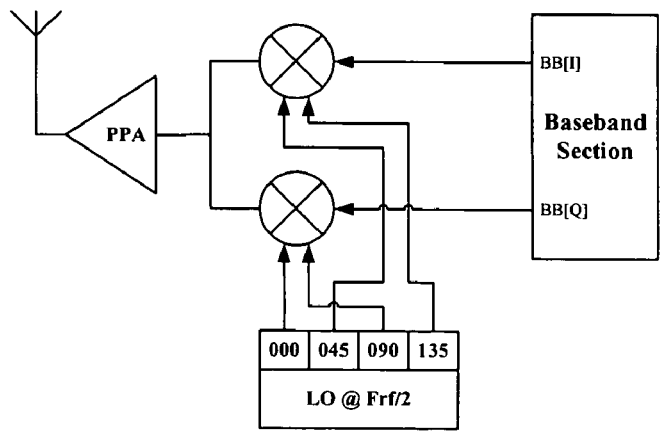
FIG. 3 is a schematic diagram that illustrates a harmonic image-rejection up-conversion transmitter.

An embodiment of an up-converter that addresses the problems of VCO pulling in transmit mode and DC offsets in receive mode is illustrated in FIG. 3. The up-converter of FIG. 3 operates at a sub-harmonic frequency of its RF signal frequency and the up-converter includes a harmonic mixer. The key element of the improvements realized by the circuit of FIG. 3 is the generation of LO signals in quadrature at this sub-harmonic frequency is done using a delay-locked loop. It is noted that signals are spaced $\pi/2N$ rad, rather than being spaced $\pi/2$ rad apart. In such embodiments, N denotes the sub-harmonic order, e.g. 2). It is note that for purposes of this disclosure, where signals are described as being spaced a certain number of rad apart, this means the signals have the same frequency but they have a phase difference equivalent to the number of rad indicated.

In order to reduce the effects of pulling, the oscillator of the circuit shown in FIG. 3 runs at a sub-harmonic (e.g., half) of the RF frequency. In this case, the up-conversion mixer employed is a harmonic mixer. Furthermore, in order to retain an image-rejection up-conversion, 45° spaced LO signals are then needed.

One possible solution for implementing a harmonic mixer applies a 45° phase shifter consisting of two RC-bridge circuits (see '*An I/Q Active Balanced Harmonic Mixer with IM2 Cancelers and a 45° phase Shifter*', IEEE Journal of Solid-State Circuits, vol. 33, no. 12, December 1998, pp 2240-2246). However, such an approach is susceptible to the same concerns that were described above with reference to RC/CR circuits.

One approach that helps overcome these concerns is illustrated in, and described with reference to FIG. 3. In this approach, two signals spaced $\pi/2$ rad apart are combined to yield either one of the I or the Q components at RF frequency. In one instance, signals with phase 0 and $\pi/2$ are taken together, in the other those with $\pi/4$ and $3\pi/4$. For each of the signals going to one mixer, there is a corresponding signal that differs $\pi/4$ rad in phase, going to the other mixer.

Figure 4:
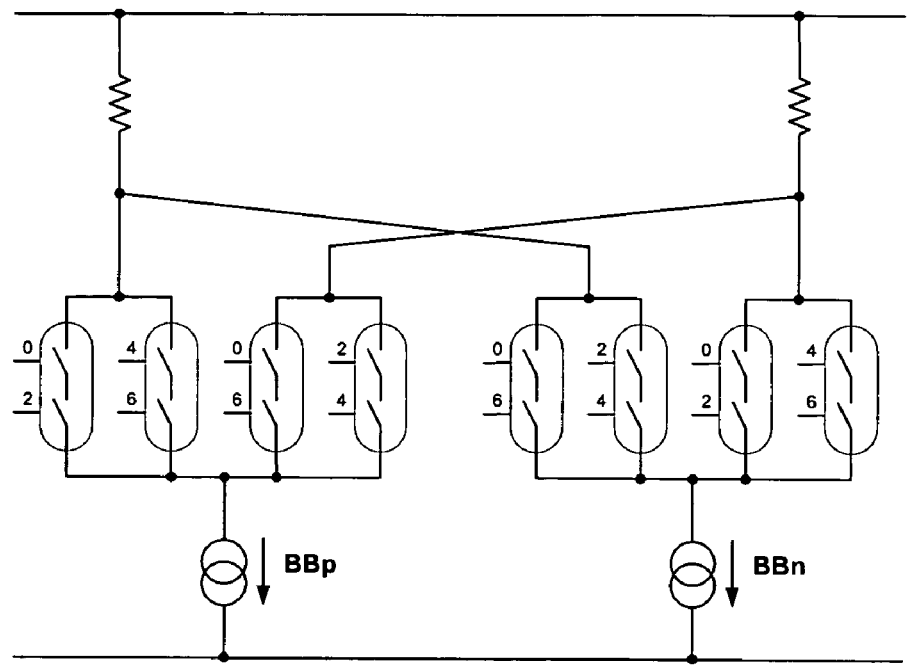
FIG. 4 is a schematic diagram that illustrates a harmonic mixer that may be used in the up-conversion transmitter of FIG. 3.

An embodiment of a harmonic up-conversion mixer circuit that may be employed in the circuit of FIG. 3 is shown in FIG. 4 (only the I-mixer is shown in FIG. 4). While the mixer in FIG. 4 appears similar to a standard Gilbert-cell mixer, the four switch transistors of a standard Gilbert-cell mixer have been replaced by a new switch structure. Gilbert cell mixers are described in more detail in "A Precise Four-Quadrant Multiplier with Subnanosecond Response", Gilbert, B.; IEEE Journal of Solid-State Circuits, Volume: 3, Issue: 4, December 1968, pp. 365-373, which is incorporated by reference herein in its entirety. In the embodiment of FIG. 4, the LO signals each have an index. Each index is proportional to the corresponding signal's phase in units of 45°, e.g., $LO_i = \cos(\omega_{LO} \cdot t + i \cdot 45°)$ with i=0,1, . . . , 7. These signals are represented in the Figures by their corresponding indices. The waveforms of the LO signals and their corresponding equivalent signals in the mixer are illustrated in the timing diagram shown in FIG. 6.

Figure 6:
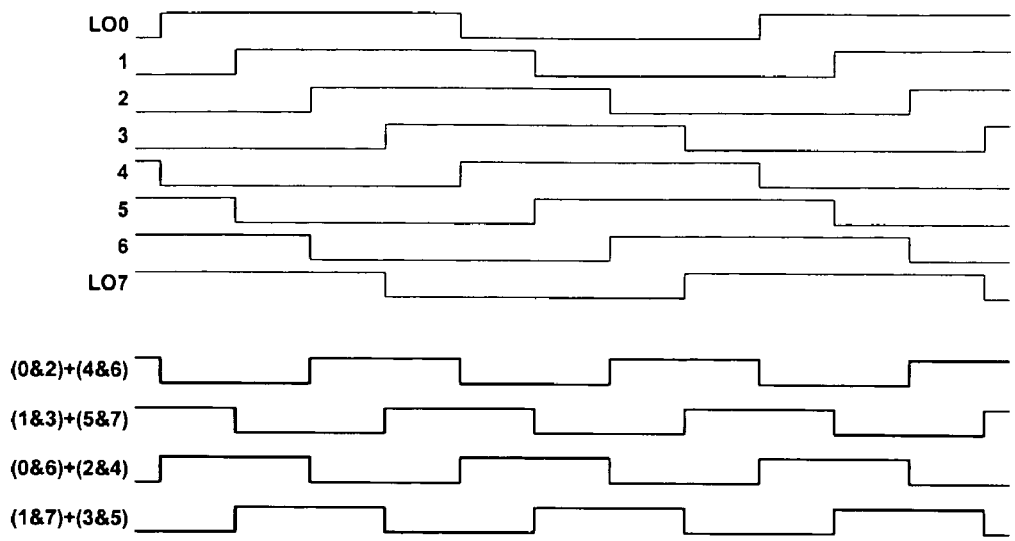
FIG. 6 is a timing diagram that illustrates various signals of the harmonic mixer of FIG. 4.
Figure 7:
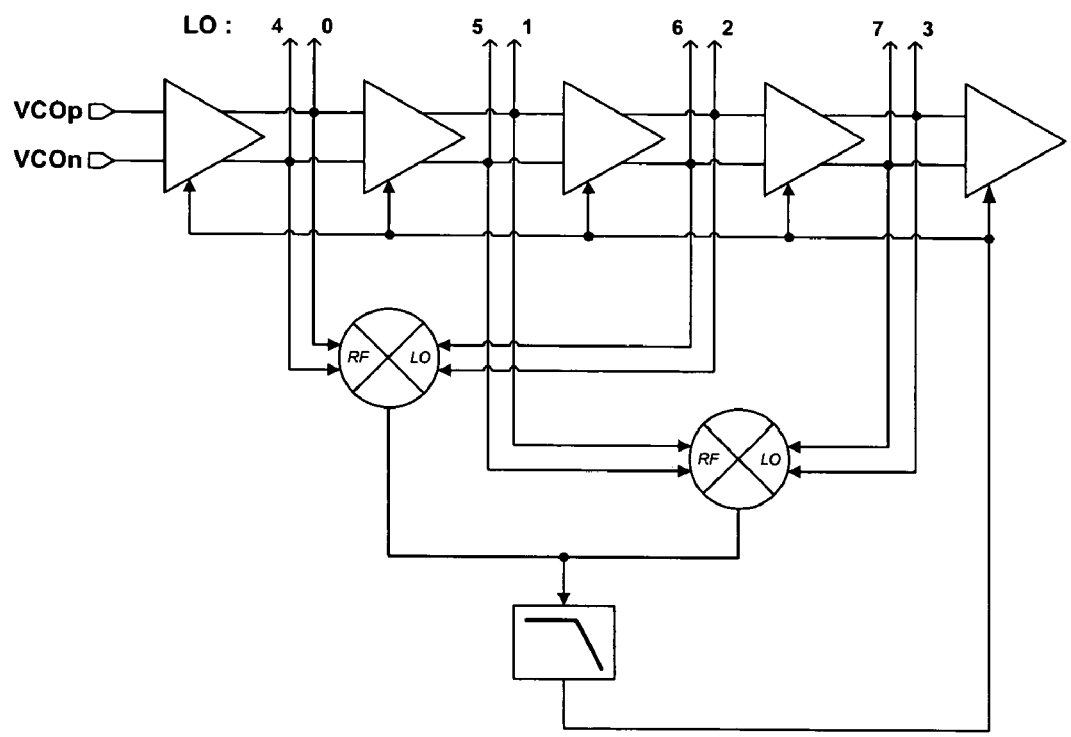
FIG. 7 is a schematic diagram that illustrates a delay-locked loop for half-frequency eight-phase local oscillator signal generation.

To create the eight half-frequency LO signals at 45° spacing shown in FIG. 6, the circuit of FIG. 7 can be used. The circuit of FIG. 7 includes of a series of voltage-controlled delay cells, the delay of which is tuned to 45° by a feedback loop similar to a PLL. Four delay cells with a delay of approximately $\pi/4$ rad are used in this circuit of FIG. 7. The circuit of FIG. 1 also includes two mixers that operate as phase detectors. However, due to their implementation as Gilbert cells, their output is zero when the 'RF' and 'LO' signals are spaced 90° apart. Therefore, to avoid deterministic phase mismatch, the phase detectors should be implemented symmetrically with respect to their RF and LO inputs. Such an approach may include using two mixers with half the number of inputs, while the inputs are those signals from the delay line that are spaced by approximately $\pi/2$.

Figure 5:
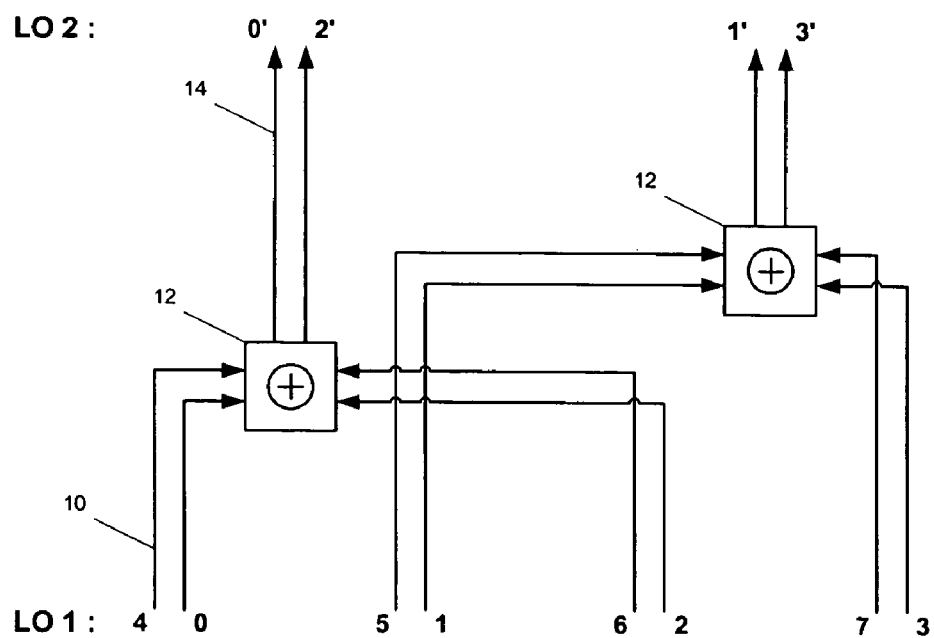
FIG. 5 is a schematic diagram that illustrates a frequency doubling device that may be used in a harmonic up-conversion transmitter.

Referring now to FIG. 5, a schematic diagram illustrating a frequency multiplication device that converts the eight-phase LO signals (designated with unaccented indices) from the delay line of FIG. 7 (which are at one-half the RF frequency of the up-converter) to new LO signals at the RF frequency (designated with accented indices) using summation circuits. The LO signals without accent shown in FIG. 7 are the inputs. The phase detector in FIG. 7 can also be used with the signals generated by the circuit of FIG. 5. The circuit of FIG. 5 may be implemented using an XOR gate for each summation circuit (which operates as a two-bit adder) to combine the half-frequency LO signals (to create a frequency doubled signal) before providing them to a mixer, such as a standard Gilbert cell. It will be appreciated that a similar circuit can be used for down-conversion.

It will be appreciated that an up-converter similar to the up-converters described above could operate using a frequency $\omega_{LO}$ that is one-third of the RF frequency. Such an approach would, for example, use twelve LO signals spaced $\pi/6$ rad (30°) apart operating at one-third the RF frequency. In this case, the LO signals would be generated as $LO_i = \cos(\omega_{LO} \cdot t + i \cdot 30°)$, with i=0,1, . . . , 11 (or i=0,1, . . . , 5 in the case of a non-symmetrical implementation is chosen). It will be appreciated that in a symmetrical case signals between 0 and $2\pi$ rad are used, while in a non-symmetric case signal between 0 and $\pi$ rad are used. For the symmetrical case, three signals are then taken together that are $\pi/3$ rad apart. For example the signal with phases 0, $\pi/3$ and $2\pi/3$ rad are taken together, or those with phases $\pi/6$, $\pi/2$ and $5\pi/6$ rad are taken together. The combination of these LO signals that are taken together are then fed into a harmonic mixer in the fashion described above.

A device or circuit for frequency conversion from RF to IF (or vice versa) includes a LO running at a sub-harmonic of the amount of desired frequency translation (e.g., the RF frequency minus the intermediate frequency $[F_{RF}-F_{IF}]$ where $F_{IF} \neq 0$) (as opposed to the previously discussed zero-IF implementations). The device further includes a circuit that generates signals derived from this local oscillator signal, where the signals are spaced $\pi/2N$ rad apart, N being an integer. The output signal (e.g., IF) is generated by mixing the input signal (e.g. RF) with the LO signals spaced $\pi/2N$ rad apart. By adding a second mixer with the other LO signals, a full image-reject mixer is obtained.

Some of the above-mentioned parameters can be selectable, such as, for example, the number of signals to be generated, the integer value N indicating at which sub-harmonic frequency the local oscillator runs, etc. Also the circuit or device for combining signals (e.g. the logic circuit) may be reconfigurable. Such small changes may have a considerable impact on the front end's functionality.

The foregoing embodiments offer several advantages. First, the pulling problem is addressed as the VCO is running at half of the RF frequency. Second, instead of routing four quadrature LO signals from the synthesizer to the receive and transmit sections of an RF transceiver, the foregoing embodiments allow for only two half frequency signals to be used. This provides for a reduction in the power consumption in the LO buffers. Further, the LO signal generating DLL of FIG. 7 can be placed twice, once close to the receive mixer and once close to the transmit mixer. For area efficiency, the two loops may share their low-frequency part. Still further, the foregoing approaches allow for implementing a frequency conversion device or circuit that operates with selectable parameters.

CONCLUSION

Various arrangements and embodiments in accordance with the present invention have been described herein. It will be appreciated, however, that those skilled in the art will understand that changes and modifications may be made to these arrangements and embodiments, as well as combinations of the various embodiments without departing from the true scope and spirit of the present invention, which is defined by the following claims.

What is claimed is:

1. A signal generator for generating signals that are spaced $\pi/X$ rad apart, wherein X is an integer, the signal generator comprising:
    at least one delay cell with a delay that approximately corresponds to a phase shift $\pi/X$ rad for a given signal,
    at least one phase detection system receiving at least two signals with a phase difference of approximately $\pi/2$ rad with respect to one another from said at least one delay cell and generating a feedback signal that is communicated to the at least one delay cell to adjust the phase relationship of the at least two signals.

2. The signal generator of claim 1, wherein a combination of the at least one delay cell and the phase detection system provides the $\pi/X$ rad spacing of the generated signals.

3. The signal generator of claim 1, wherein the phase detection system comprises a mixer.

4. The signal generator of claim 1, further comprising a low pass filter filtering the feedback signal.

5. The signal generator of claim 4, wherein the feedback signal is communicated to each delay cell of the at least one delay cell.

6. A circuit for converting at least two signals of a first frequency to a signal of a second frequency comprising:
    a signal generator generating a plurality of signals at the first frequency, the at least two signals of the first frequency being selected from the plurality of signals, the first frequency being a sub-harmonic frequency of the second frequency, the signal generator comprising:
        at least one delay cell with a delay that approximately corresponds to a phase shift $\pi/X$ rad for the at least two signals of the first frequency;
        at least one phase detection system receiving the at least two signals of the first frequency with a phase difference of approximately $\pi/2$ rad with respect to one another from said at least one delay cell and generating a feedback signal that is communicated to the at least one delay cell to adjust the phase relationship of the at least two signals of the first frequency; and
    a first signal combiner coupled with the signal generator, the first signal combiner receiving the at least two signals of the first frequency and generating the signal of the second frequency.

7. The circuit of claim 6, wherein the at least two signals of the first frequency are spaced $2\pi/X$ rad apart and the second frequency is X/2 times larger than the first frequency.

8. The circuit of claim 7, wherein X equals 4.

9. The circuit of claim 6, further comprising a second signal combiner coupled with the signal generator, the second signal combiner receiving at least two additional signals of the first frequency selected from the plurality of signals of the first frequency and generating another signal of the second frequency.

10. The circuit of claim 9, wherein the at least two additional signals of the first frequency are spaced $2\pi/X$ rad apart and for each of said at least two additional signals there is a signal among the at least two signals of the first frequency to be combined by the first signal combiner that differs by $\pi/X$ rad in phase from it corresponding signal.

11. The circuit of claim 10, wherein X equals 4.

12. The circuit of claim 10, wherein the first signal combiner generates an in-phase signal and the second signal combiner generates a quadrature signal.

13. The circuit of claim 6, wherein the first signal combiner comprises an XOR gate.

14. The circuit of claim 6, wherein the first signal combiner comprise a combination of switches.

15. A circuit for frequency multiplication generating at least one output signal, the circuit comprising:
    a local oscillator operating at a sub-harmonic frequency of a transceived signal;
    a signal generator actively generating signals that are spaced $\pi/2N$ rad apart, N being an integer; wherein the local oscillator runs at the Nth sub-harmonic of said transceived signal and the at least one output signal is generated by the signals that are spaced $\pi/2N$ rad apart.

16. The circuit of claim 15, wherein the signal generator includes a feedback mechanism for maintaining the generated signals spaced $\pi/2N$ rad apart.

17. The circuit of claim 15, wherein the signal generator comprises:
    at least one delay cell with a delay that approximately corresponds to a phase shift $\pi/X$ rad for a given signal,
    at least one phase detection system receiving at least two signals with a phase difference of approximately $\pi/2$ rad with respect to one another from said at least one delay cell and generating a feedback signal that is communicated to the at least one delay cell to adjust the phase relationship of the at least two signals.

18. The circuit of claim 15, further comprising a mixer to which the at least one output signal and the transceived signal are communicated for conversion, wherein the circuit is included in a front-end device for radio frequency communications.

19. The circuit of claim 15, wherein the conversion is one of up-conversion and down-conversion.

20. The circuit of claim 15, further comprising a mixer to which the at least one output signal and the transceived signal are communicated for conversion, wherein the circuit is included in a zero or low-IF front end device for radio frequency communications.

* * * * *